US011643360B2

(12) United States Patent
Xing et al.

(10) Patent No.: US 11,643,360 B2
(45) Date of Patent: May 9, 2023

(54) ELECTRONIC-GRADE GLASS FIBER COMPOSITION, AND GLASS FIBER AND ELECTRONIC FABRIC THEREOF

(71) Applicant: JUSHI GROUP CO., LTD., Tongxiang (CN)

(72) Inventors: Wenzhong Xing, Tongxiang (CN); Guorong Cao, Tongxiang (CN); Lin Zhang, Tongxiang (CN); Xiucheng Hong, Tongxiang (CN); Shuangbao Zuo, Tongxiang (CN); Zhonghua Yao, Tongxiang (CN)

(73) Assignee: JUSHI GROUP CO., LTD., Tongxiang (CN)

( * ) Notice: Subject to any disclaimer, the term of this patent is extended or adjusted under 35 U.S.C. 154(b) by 178 days.

(21) Appl. No.: 16/966,830

(22) PCT Filed: Oct. 30, 2019

(86) PCT No.: PCT/CN2019/114267
§ 371 (c)(1),
(2) Date: Jul. 31, 2020

(87) PCT Pub. No.: WO2021/056679
PCT Pub. Date: Apr. 1, 2021

(65) Prior Publication Data
US 2021/0130226 A1 May 6, 2021

(30) Foreign Application Priority Data

Sep. 25, 2019 (CN) .......................... 201910912666.7

(51) Int. Cl.
| | | |
|---|---|---|
| *C03C 13/00* | (2006.01) | |
| *C03C 3/118* | (2006.01) | |
| *C03C 3/091* | (2006.01) | |
| *H05K 1/03* | (2006.01) | |
| *C03C 3/112* | (2006.01) | |

(52) U.S. Cl.
CPC .............. *C03C 13/00* (2013.01); *C03C 3/091* (2013.01); *C03C 3/112* (2013.01); *C03C 3/118* (2013.01); *H05K 1/0306* (2013.01); *H05K 1/038* (2013.01); *C03C 2213/00* (2013.01)

(58) Field of Classification Search
CPC ......... C03C 3/091; C03C 3/093; C03C 3/118; C03C 3/112; C03C 13/00; C03C 13/002; C03C 13/06; C03C 2213/00; H05K 1/0306; H05K 1/038; D03D 15/00; D03D 15/267
See application file for complete search history.

(56) References Cited

U.S. PATENT DOCUMENTS

| | | |
|---|---|---|
| 7,022,634 B2 | 4/2006 | Hamilton et al. |
| 9,499,432 B2 | 11/2016 | Yves et al. |
| 11,078,109 B2 | 8/2021 | Cao et al. |
| 2003/0207748 A1 | 11/2003 | Wallenberger |
| 2005/0107238 A1* | 5/2005 | Li ............................. C03C 3/091 501/70 |
| 2006/0166805 A1 | 7/2006 | Li et al. |
| 2006/0211562 A1 | 9/2006 | Fisler |
| 2010/0222198 A1* | 9/2010 | Zhang ..................... C03C 13/00 501/38 |
| 2012/0135849 A1 | 5/2012 | Hoffman et al. |
| 2016/0264453 A1 | 9/2016 | Peters et al. |

FOREIGN PATENT DOCUMENTS

| | | | |
|---|---|---|---|
| CN | 1243501 A | | 2/2000 |
| CN | 1392870 A | | 1/2003 |
| CN | 1589243 A | | 3/2005 |
| CN | 1688515 A | | 10/2005 |
| CN | 101503279 A | | 8/2009 |
| CN | 101575172 A | * | 11/2009 |
| CN | 101575172 A | | 11/2009 |
| CN | 102770383 A | | 11/2012 |
| CN | 102849957 A | * | 1/2013 |
| CN | 102849957 A | | 1/2013 |
| CN | 102976620 A | | 3/2013 |
| CN | 109678350 A | | 4/2019 |
| JP | 5777043 A | | 5/1982 |
| JP | S60264345 A | | 12/1985 |
| JP | 2000247683 A | | 9/2000 |

(Continued)

OTHER PUBLICATIONS

Wallenberger et al., Glass Fibers, 2001, ASM International, pp. 1-9. (Year: 2001).*
World Intellectual Property Organization (WIPO) International Search Report and Written Opinion for PCT/CN2019/114267 dated Jun. 17, 2020 11 Pages.
Japan Patent Office The Notice of reasons for refusal for Japanese Application No. 2020544939 dated Dec. 21, 2021 9 pages (with translation).
European Patent Office European Search Report for Application No. EP19909626 dated Oct. 5, 2021 6 pages.
Russian Patent Office The Office Action for Application No. 2021109709/03(020887) dated Feb. 10, 2022 14 pages (with translation).

(Continued)

*Primary Examiner* — Elizabeth A. Bolden

(74) *Attorney, Agent, or Firm* — Anova Law Group, PLLC

(57) ABSTRACT

An electronic-grade glass fiber composition includes the following components with corresponding amounts by weight percentages: 54.2-60% $SiO_2$, 11-17.5% $Al_2O_3$, 0.7-4.5% $B_2O_3$, 18-23.8% CaO, 1-5.5% MgO, less than or equal to 24.8% CaO+MgO, less than 1% $Na_2O+K_2O+Li_2O$, 0.05-0.8% $TiO_2$, 0.05-0.7% $Fe_2O_3$, and 0.01-1.2% $F_2$. The weight percentage ratio $C1=SiO_2/(RO+R_2O)$ is greater than or equal to 2.20, and the total weight percentage of the above components is greater than or equal to 98.5%.

18 Claims, No Drawings

(56) References Cited

FOREIGN PATENT DOCUMENTS

| | | | | |
|---|---|---|---|---|
| JP | 2000247683 A | * | 9/2000 | ............. C03C 13/00 |
| JP | 2003505318 A | | 2/2003 | |
| JP | 2012519144 A | | 8/2012 | |
| RU | 2641050 C2 | | 1/2018 | |

OTHER PUBLICATIONS

Japan Patent Office Notice of Reasons for Refusal for Application No. 2020544939 dated May 31, 2022 6 pages (with translation).
Intellectual Property India Examination Report for Application No. 202027041637 dated Mar. 2, 2023 7 pages.

* cited by examiner

ELECTRONIC-GRADE GLASS FIBER COMPOSITION, AND GLASS FIBER AND ELECTRONIC FABRIC THEREOF

CROSS-REFERENCE TO RELATED APPLICATIONS

The present application is a national stage entry under 35 U.S.C. § 371 of International Application No. PCT/CN2019/114267, filed on Oct. 30, 2019, which claims priority to Chinese Patent Application No. 201910912666.7, filed on Sep. 25, 2019 and entitled "Electronic-grade glass fiber composition, and glass fiber and electronic fabric thereof," the disclosures of both of which are incorporated herein by reference in their entireties.

TECHNICAL FIELD

The disclosure relates to a glass fiber composition, in particular, to electronic-grade glass fiber compositions that can be used in the electronic industry, and to a glass fiber and electronic fabric thereof.

BACKGROUND

Glass fiber is an inorganic fiber material. As a functional base material for electronic industry, electronic-grade glass fibers is mainly used in such fields as communications, computer, IC packaging, consumer electronics, automotive electronics, etc. The industrial chain of "electronic glass fiber, electronic fabric, copper clad plate and printed circuit board (PCB)" is the core application of electronic glass fiber. In order to meet the dielectric properties of PCB, electronic-grade glass fiber is required to have good dielectric properties.

At present, the electronic-grade glass fiber for PCB both at home and abroad is mainly D-glass fiber having a high boron content, and conventional E-glass fiber. D-glass fiber is a low dielectric glass fiber, its dielectric properties are better than that of conventional E-glass fiber, and it can meet the requirements of high-density and high-rate information processing. D-glass fiber mainly comprises 20-25% $B_2O_3$, 72-76% $SiO_2$, 0-5% $Al_2O_3$ and 2-4% $Na_2O+K_2O$, as expressed in percentage by weight. The dielectric constant of D-glass fiber (1 MHz at room temperature) is below 4.5, but it is difficult to melt and draw for D-glass fiber. For example, its forming temperature is more than 1400° C., which is difficult to realize a large-scale tank furnace production. At the same time, the drilling performance and water resistance of the D-glass fiber products are poor, which is unfavorable for subsequent processing and using. It also has the disadvantage of a high cost of raw materials.

As conventional electronic-grade glass fiber, the conventional E-glass fiber having a high boron content is the main commercial electronic glass fiber at present. The dielectric constant of conventional E-glass fiber is generally 6.7-7.1, which can meet the requirements of conventional printed circuit boards, and conventional E glass fiber has the advantage of good melting performance and excellent processability. However, in practice, the $B_2O_3$ content of conventional E-glass fiber produced by various companies is generally 7.2%, with a deviation of ±0.4%, so the raw materials are still costly. Moreover, the presence of a large number of boron in raw materials leads to a high volatility of the batch, which not only is easy to accelerate the high-temperature corrosion of the refractories for the furnace, but also limits the use of efficient roof-firing method for the melting of the composition for producing a glass fiber for electronic applications. Besides, the conventional E-glass fiber has other disadvantages, such as poor acid resistance, poor mechanical properties and unsatisfactory water resistance.

In addition, the main focus of general-purpose glass fiber for reinforcement is mechanical properties and corrosion resistance. Take boron-free E-glass fiber as an example. Its composition is free of boron, or even free of fluorine at the same time, and the total amount of alkali metal and alkaline earth metal oxides will have to be increased, so as to reduce the viscosity and melting difficulty of glass. Thus the production difficulty will be lowered while the production efficiency will be raised. As a result, it is difficult for the electrical properties of boron-free E glass fiber and the drilling performance of the glass fiber boards to meet the requirements of PCB, so the boron-free E-glass fiber is not suitable for producing electronic-grade glass fiber.

At present, many glass fiber enterprises and research institutions focus on the research and development of low dielectric glass fiber, while the research and innovation on electronic-grade E-glass fiber is very scarce. Practically, there are many problems in the conventional electronic-grade E-glass fiber. In terms of improving glass properties, reducing costs, decreasing volatilization, minimizing corrosion of refractories, and using advanced furnace firing technologies, there still remains significant potential of improvement for the conventional electronic-grade E-glass fiber.

SUMMARY

In order to solve the issue described above, the present disclosure aims to provide a low-cost, high corrosion resistance composition of electronic-grade glass fiber. The composition can not only improve the dielectric properties of glass, and increase the mechanical properties, water resistance and acid resistance of glass fiber, but also significantly reduce the cost of raw materials, significantly decrease the volatilization of raw materials, and minimize the corrosion of refractories. Thus, the composition is suitable for large-scale tank furnace production.

In accordance with one aspect of the present disclosure, there is provided a composition for producing an electronic-grade glass fiber, the composition comprising percentage amounts by weight of the following components:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O$=$Na_2O$ + $K_2O$ + $Li_2O$ | <1% |
| $TiO_2$ | 0.05-0.8% |
| $Fe_2O_3$ | 0.05-0.7% |
| $F_2$ | 0.01-1.2% | wherein, the weight percentage ratio C1=$SiO_2$/(RO+$R_2O$) is greater than or equal to 2.20, and the total weight percentage of the above components is greater than or equal to 98.5%.

In a class of this embodiment, the weight percentage ratio C2=($SiO_2$+$Al_2O_3$−$B_2O_3$)/(RO+$R_2O$) is greater than or equal to 2.73.

In a class of this embodiment, the weight percentage ratio C3=($SiO_2$+$Al_2O_3$)/(RO+$R_2O$+$B_2O_3$) is greater than or equal to 2.50.

In a class of this embodiment, the weight percentage ratio $C4=B_2O_3/R_2O$ is greater than or equal to 1.

In a class of this embodiment, the composition comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O$=$Na_2O$ + $K_2O$ + $Li_2O$ | <1% |
| RO + $R_2O$ | ≤25.2% |
| $TiO_2$ | 0.05-0.8% |
| $Fe_2O_3$ | 0.05-0.7% |
| $F_2$ | 0.01-1.2% | wherein, the weight percentage ratio $C1=SiO_2/(RO+R_2O)$ is greater than or equal to 2.20, and the total weight percentage of the above components is greater than or equal to 98.5%.

In a class of this embodiment, the content range of RO is 20-24.4% in percentage amounts by weight.

In a class of this embodiment, the combined content range of RO+$R_2O$ is 20.5-25% in percentage amounts by weight.

In a class of this embodiment, the content range of $R_2O$ is less than or equal to 0.8% in percentage amounts by weight.

In a class of this embodiment, the content range of $F_2$ is 0.05-1.2% in percentage amounts by weight.

In a class of this embodiment, the weight percentage ratio of $K_2O/Na_2O$ is greater than 0.5.

In a class of this embodiment, the combined content range of $Al_2O_3$+MgO is 13-19.1% in percentage amounts by weight.

In a class of this embodiment, the composition comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O$=$Na_2O$ + $K_2O$ + $Li_2O$ | <1% |
| $TiO_2$ | 0.05-0.8% |
| $Fe_2O_3$ | 0.05-0.7% |
| $F_2$ | 0.01-1.2% | wherein, the weight percentage ratio $C1=SiO_2/(RO+R_2O)$ is greater than or equal to 2.20, the weight percentage ratio $C2=(SiO_2+Al_2O_3-B_2O_3)/(RO+R_2O)$ is greater than or equal to 2.73, the weight percentage ratio $C3=(SiO_2+Al_2O_3)/(RO+R_2O+B_2O_3)$ is greater than or equal to 2.50, and the total weight percentage of the above components is greater than or equal to 98.5%.

In a class of this embodiment, the composition comprises the following components expressed as percentage amounts by weight:

| | |
|---|---|
| $SiO_2$ | 55-59.5% |
| $Al_2O_3$ | 11.5-16.5% |
| $B_2O_3$ | 0.7-4.5% |
| CaO | 18-23.3% |
| MgO | 1-4.5% |
| RO=CaO + MgO | ≤24.4% |
| $R_2O$=$Na_2O$ + $K_2O$ + $Li_2O$ | <1% |
| RO + $R_2O$ | 20.5-25% |
| $TiO_2$ | 0.05-0.8% |
| $Fe_2O_3$ | 0.05-0.7% |
| $F_2$ | 0.05-1.2% | wherein, the weight percentage ratio $C1=SiO_2/(RO+R_2O)$ is greater than or equal to 2.20, the weight percentage ratio $C2=(SiO_2+Al_2O_3-B_2O_3)/(RO+R_2O)$ is greater than or equal to 2.73, and the total weight percentage of the above components is greater than or equal to 98.5%.

In a class of this embodiment, the composition comprises the following components expressed as percentage amounts by weight:

| | |
|---|---|
| $SiO_2$ | 55-59.5% |
| $Al_2O_3$ | 12-15.9% |
| $B_2O_3$ | 1-3.5% |
| CaO | 18-23.3% |
| MgO | 1.1-4% |
| RO=CaO + MgO | ≤24.4% |
| $R_2O$=$Na_2O$ + $K_2O$ + $Li_2O$ | ≤0.8% |
| RO + $R_2O$ | 20.5-25% |
| $TiO_2$ | 0.05-0.8% |
| $Fe_2O_3$ | 0.05-0.7% |
| $F_2$ | 0.05-1.2% | wherein, the range of the weight percentage ratio $C1=SiO_2/(RO+R_2O)$ is 2.24-2.75, the range of the weight percentage ratio $C2=(SiO_2+Al_2O_3-B_2O_3)/(RO+R_2O)$ is 2.75-3.35, the weight percentage ratio $C3=(SiO_2+Al_2O_3)/(RO+R_2O+B_2O_3)$ is greater than or equal to 2.50, and the total weight percentage of the above components is greater than or equal to 98.5%.

In a class of this embodiment, the composition contains one or more components selected from the group consisting of $SO_3$, SrO, $CeO_2$, $La_2O_3$, $Y_2O_3$, $ZrO_2$ and ZnO, the combined weight percentage being less than 1.5%.

According to another aspect of this disclosure, an electronic-grade glass fiber produced with the electronic-grade glass fiber composition is provided.

Preferably, the electronic-grade glass fiber has a dielectric constant range of 6.0-7.0 at 1 MHz at room temperature.

According to yet another aspect of this disclosure, an electronic fabric incorporating the electronic-grade glass fiber is provided.

Preferably, the electronic fabric is used as a base material for printed circuit boards.

The electronic-grade glass fiber composition according to the present disclosure specifically relates to a composition of electronic-grade glass fiber that has low cost and high corrosion resistance. The composition contains a low content of $B_2O_3$, and the content ratio of $SiO_2/(RO+R_2O)$ of the composition is controlled by mainly adjusting the contents of alkali metal oxides and alkali earth metal oxides, as well as total content of the two, and also adjusting the contents of $SiO_2$, $Al_2O_3$, $B_2O_3$ and $F_2$. Further, the synergistic effects between the group of silicon ions, boron ions, and aluminum ions, and the group of alkali metal ions and alkaline earth metal ions is improved by controlling the ratios of $(SiO_2+Al_2O_3-B_2O_3)/(RO+R_2O)$, $(SiO_2+Al_2O_3)/(RO+R_2O+B_2O_3)$, and $B_2O_3/R_2O$, and etc. Through the control of aforementioned component contents and ratios, the electronic-grade glass fiber composition according to the present disclosure not only can improve the electrical properties, especially dielectric properties, of the glass, but also can increase the mechanical properties, water resistance, and acid resistance of the glass, and also can significantly reduce the cost of raw materials, significantly decrease the volatilization of raw materials, and minimize the corrosion to refractories. Thus, the composition is suitable for large-scale tank furnace production.

Specifically, the electronic-grade glass fiber composition according to the present disclosure comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O=Na_2O + K_2O + Li_2O$ | <1% |
| $TiO_2$ | 0.05-0.8% |
| $Fe_2O_3$ | 0.05-0.7% |
| $F_2$ | 0.01-1.2% | wherein, the weight percentage ratio $C1=SiO_2/(RO+R_2O)$ is greater than or equal to 2.20, and the total weight percentage of the above components is greater than or equal to 98.5%.

The effect and content of each component in the electronic-grade glass fiber composition is described as follows.

As a glass network former oxide of glass, $SiO_2$ is a main oxide forming the glass network and can barely move under the influence of electric field. In the electronic-grade glass fiber composition of the present disclosure, the content range of $SiO_2$ is 54.2-60%. In order to ensure that the glass has sufficient dielectric and mechanical properties, the silicon oxide content shall not be less than 54.2%; on the other hand, in order to prevent the viscosity and liquidus temperature of the glass from being too high, which would otherwise make it difficult to achieve a large-scale production, the silicon oxide content shall not be greater than 60%. Preferably, the weight percentage range of $SiO_2$ can be 54.2-59.5%, more preferably 55-59.5%, and still more preferably 55-59%.

Alkali metal oxides are glass network modifiers and such alkali metal oxides as $Na_2O$, $K_2O$ and $Li_2O$ can reduce the viscosity of glass and improve the melting performance of glass. They can also effectively provide free oxygen, form a good synergistic effect in combination with boron ions and aluminum ions, and generate a certain amount of tetrahedrons with negative charges. These tetrahedrons will play a role in restraining $Na^+$ ions by limiting their movement, and thus achieve a better structural stacking effect. However, alkali metal oxides have a significant effect on the electrical properties of glass. With the increase of alkali metal oxides in the glass, the amount of monovalent alkali metal ions as well as non-bridging oxygen ions that can easily polarize will increase, and the conductivity and dielectric constant of the glass will accordingly be raised.

According to the electronic-grade glass fiber composition of the present disclosure, we have found that the effect of $Na_2O$ on the electrical properties of glass is greater than that of $K_2O$ and $Li_2O$, which is related to the fact that it is easier for $Na_2O$ to provide non-bridging oxygen ions with high polarizability; meanwhile, the dual alkali effect is significant, as the conductivity of the glass containing both $K_2O$ and $Na_2O$ is lower than that of the glass containing only $Na_2O$. Besides, better dielectric properties can be obtained by rationally controlling the $K_2O/Na_2O$ ratio. That is because, under the effect of an external electric field, the vacancies left by $Na^+$ ions are smaller than that by $K^+$ ions when monovalent metal ions move. As the big $K^+$ ions cannot enter the small vacancies, the path is blocked, which results in hindering the movement of small ions and restricting the ions mobility.

Therefore, in order to ensure the excellent dielectric properties of glass, not only the total content of alkali metal oxides should be restricted, but also the ratios between these oxides need to be reasonably controlled. In the electronic-grade glass fiber composition of this disclosure, the content range of $R_2O=Na_2O+K_2O+Li_2O$ is less than 1% in percentage amounts by weight. Preferably, the content range of $R_2O$ is less than or equal to 0.8% in percentage amounts by weight. More preferably, the content range of $R_2O$ is 0.1-0.8% in percentage amounts by weight. Still more preferably, the content range of $R_2O$ is 0.1-0.65% in percentage amounts by weight. Most preferably, the content range of $R_2O$ is 0.1-0.5% in percentage amounts by weight.

Furthermore, the weight percentage of $Na_2O+K_2O$ can be less than or equal to 0.8%, and preferably can be 0.1-0.65%. Further, the weight percentage of $Na_2O$ can be 0.5% or less, preferably 0.05-0.35%, and more preferably 0.05-0.2%. Further, the weight percentage of $K_2O$ can be 0.05-0.5%, preferably 0.05-0.35%. Further, the weight percentage of $Li_2O$ can be 0.2% or less, and preferably can be 0.1% or less.

Furthermore, in order to improve the electrical properties of glass, the weight percentage ratio of $K_2O/Na_2O$ can be greater than 0.5, preferably greater than or equal to 0.75, and more preferably greater than or equal to 1. In addition, in another embodiment of this disclosure, the electronic-grade glass fiber composition according to this disclosure may be free of $Li_2O$. In still another embodiment of this disclosure, the weight percentage of $Na_2O$ can be 0.05-0.35%, and the weight percentage ratio of $K_2O/Na_2O$ can be 1 or greater.

CaO is also a network modifier of the glass. It has the effect of regulating the viscosity of the glass and improving the chemical stability and mechanical strength of the glass. It also can help to reduce the hardening rate of molten glass and accelerate the fiberizing process of the glass. At the same time, having the similar ionic radius, the $Ca^{2+}$ and $Na^+$ ions are more likely to form cross filling in the gaps of glass structure. Moreover, with greater electric field strength than that of $Na^+$ ions, the $Ca^{2+}$ ions filling in the glass vacancies are more capable of blocking the ion migration channels. So $Ca^{2+}$ ions can effectively inhibit the migration of $Na^+$ ions and thus lower the conductivity and dielectric constant of glass.

In the electronic-grade glass fiber composition according to this disclosure, the weight percentage range of CaO can be 18-23.8%. Too low of a CaO content would not generate an excellent effect mentioned above; if the content is too high, the amount of non-bridging oxygen ions in the glass will be too high, leading to the increase of dielectric constant and conductivity, and at the same time, the crystallization risk of the glass will be increased. Preferably, the weight percentage range of CaO can be 18-23.3%, more preferably 18-22.8%, and even more preferably 18-21.9%.

MgO is an intermediate oxide of the glass, and can regulate the viscosity of glass and control the crystallization of glass. The Mg—O bond is covalent to some extent, but its dominant feature is being ionic. In a network having insufficient "free oxygen", Mg—O bonds have an effect of "accumulation", which helps to reduce the conductivity and dielectric constant of glass. Meanwhile, the ionic radius of $Mg^{2+}$ is smaller than that of either $Na^+$ or $K^+$, while its ionic field strength is significantly higher, so that the bonding between Mg' ions and oxygen ions in glass is relatively stronger, which can effectively inhibit the migration of alkali metal ions of Na$^+$ and K$^+$. However, the content of MgO should not be too high, otherwise the risk of glass devitrification will be greatly raised.

In the electronic-grade glass fiber composition according to this disclosure, the range of the weight percentage of MgO can be 1-5.5%. In this disclosure, an appropriate amount of MgO is used in conjunction with CaO and Al$_2$O$_3$, so that calcium ions can provide some free oxygen while filling the network gaps, and thus produce a synergistic stacking effect together with magnesium ions and aluminum ions. In this way, a more compact structural accumulation is achieved, and a mixed crystal state consisting of wollastonite (CaSiO$_3$), diopside (CaMgSi$_2$O$_6$) and feldspar (CaAl$_2$Si$_2$O$_8$) is obtained during devitrification of the glass. Thus, the devitrification risk is reduced and dielectric properties of the glass is improved.

Preferably, the weight percentage range of MgO can be 1-4.5%, more preferably can be greater than 1% and less than or equal to 4%, and even more preferably can be 1.1-4%.

In order to obtain a lower dielectric constant and a better devitrification rate, in the electronic-grade glass fiber composition according to this disclosure, the weight percentage range of RO=CaO+MgO can be less than or equal to 24.8%. Preferably, the weight percentage range of CaO+MgO can be less than or equal to 24.4%, more preferably can be 20-24.4%, even more preferably can be 20-23.9%, and still even more preferably can be 20-23.5%. Further, the weight percentage range of RO+R$_2$O can be less than 25.5%. Preferably, the weight percentage range of RO+R$_2$O can be less than or equal to 25.2%, more preferably can be 20.5-25%, even more preferably can be 20.5-24.7%, and still even more preferably can be 21-24.3%.

In order to control the amount of non-bridging oxygen and mobile ions in the glass structure, reduce the concentration and activity of network modifying ions so as to reduce the dielectric constant of the glass, and take into account the melting and refining effect of the glass, in the electronic-grade glass fiber composition according to this disclosure, the range of the weight percentage ratio C1=SiO$_2$/(RO+R$_2$O) can be greater than or equal to 2.20. Preferably, the range of weight percentage ratio C1 can be 2.20-2.80, more preferably can be 2.24-2.75, and even more preferably can be 2.28-2.70.

B$_2$O$_3$ is another network forming oxide of the glass. It can improve many properties of the glass and is also a good fluxing agent. At the same time, boron can be present in the form of [BO$_3$] triangles and/or [BO$_4$] tetrahedrons under different conditions. At high melting temperatures, it is difficult to form [BO$_4$] tetrahedrons, and [BO$_3$] triangles will be formed, which is the main reason why B$_2$O$_3$ can reduce the glass viscosity at high temperatures; at low temperatures, B$^{3+}$ has the tendency to capture free oxygen to form boron oxygen tetrahedrons, which plays a role in network filling. And the volume of a [BO$_4$] tetrahedron is smaller than that of a [SiO$_4$] tetrahedron, which makes the glass structure tend to be more compact and thus helps to reduce the conductivity and dielectric constant of glass.

However, the price of boron-containing raw materials is very high. Moreover, boron is a volatile substance, and the presence of a large number of boron-containing raw materials leads to high volatility of the batch, which accelerates high temperature corrosion to refractories of the furnace, and also limits the use of efficient heating method of roof-firing in a furnace for producing electronic-grade glass fiber. Besides, the acid resistance, mechanical properties and water resistance of electronic-grade glass fiber having a high boron content are poor.

In the electronic-grade glass fiber composition according to this disclosure, the weight percentage range of B$_2$O$_3$ can be 0.7-4.5%. Preferably, the weight percentage range of B$_2$O$_3$ can be 0.7-4%, more preferably 1-3.5%, and even more preferably can be 1.4-3%. Besides, in another embodiment of this disclosure, the weight percentage range of SiO$_2$ can be greater than 57% and less than or equal to 60%, and the weight percentage range of B$_2$O$_3$ is 0.7-2%.

Al$_2$O$_3$ is an intermediate oxide of the glass and also a main oxide forming the glass network. When combined with SiO$_2$, it can have a substantive effect on the mechanical properties of the glass and a significant effect on glass devitrification and water resistance. In the E-glass with a high boron content, due to the stronger tendency of combination between B$^{3+}$ and oxygen ions, the tetrahedral coordination of Al$^{3+}$ is disturbed under the influence of a large number of B$^{3+}$ ions with high field strength. Therefore, the ability of Al$^{3+}$ ions to capture free oxygen so as to form alumina tetrahedron is weakened, and Al$^{3+}$ ions in the glass tend to be in the form of octahedrons. When the content of Al$_2$O$_3$ is properly increased while the content of B$_2$O$_3$ is decreased, the tendency of Al$^{3+}$ to capture free oxygen and form alumina tetrahedrons can be enhanced, the effect of network filling can be strengthened, and the number of easily polarized non-bridging oxygen ions can be reduced. Thus, the dielectric constant of glass would be reduced.

In the electronic-grade glass fiber composition according to this disclosure, the weight percentage range of Al$_2$O$_3$ can be 11-17.5%. In order to ensure that the glass has sufficient water resistance, mechanical properties and dielectric properties, the alumina content shall not be less than 11%; and its content shall not be too high, with the maximum being 17.5%. Otherwise, the risk of glass devitrification and phase separation will be greatly increased, leading to excessively high liquidus temperatures and high crystallization rates. This will make it undesirable for large-scale production. Preferably, the content range of Al$_2$O$_3$ can be 11.5-16.5%, more preferably can be 12-15.9%.

While ensuring electrical properties of the glass, in order to improve the mechanical properties and corrosion resistance, and take into account the melting and refining effect of the glass, the boron oxide content can be appropriately reduced so as to have a control on the competition between boron ions and aluminum ions in capturing non-bridging oxygen in the glass. Further, the weight percentage ratio C2=(SiO$_2$+Al$_2$O$_3$−B$_2$O$_3$)/(RO+R$_2$O) can be greater than or equal to 2.73. Preferably, the weight percentage ratio C2 can be 2.73-3.35, more preferably can be 2.75-3.35, even more preferably can be 2.79-3.25, and still even more preferably can be 2.84-3.25.

Furthermore, while ensuring mechanical properties of the glass, in order to further reduce the cost of raw materials, and take into account the electrical properties and melting and refining effect of glass, the weight percentage ratio C3=(SiO$_2$+Al$_2$O$_3$)/(RO+R$_2$O+B$_2$O$_3$) in the present disclosure can be greater than or equal to 2.50. Preferably, the weight percentage ratio C3 can be 2.55-3.25, more preferably can be 2.60-3.25, even more preferably can be 2.65-3.20, and still even more preferably can be 2.70-3.20.

Furthermore, in order to control the quantities of non-bridging oxygen, alkali metal ions and boron ions as well as the competition therebetween in the glass, reduce the dielectric constant and conductivity, and take into account the mechanical properties and cost of raw materials, the weight percentage ratio C4=$B_2O_3$/$R_2O$ in the present disclosure can be greater than or equal to 1. Preferably, the weight percentage ratio C4 can be 1.2-12, more preferably can be 1.5-10, even more preferably can be 2-8.

Furthermore, in order to control the crystallization temperature and rate, and take into account the electrical and mechanical properties of glass, the weight percentage ratio ($Al_2O_3$+MgO)/$SiO_2$ in the present disclosure can be less than or equal to 0.34, preferably can be 0.23-0.33.

Furthermore, the weight percentage of $Al_2O_3$+MgO in the present disclosure can be 12.5-21%, preferably can be 13-19.1%, and more preferably can be 14.5-19.1%.

Furthermore, in order to improve the electrical and mechanical properties of glass, the weight percentage of $Al_2O_3$+MgO+$B_2O_3$ in the present disclosure can be 15-23%, and preferably can be 16-21.9%.

$TiO_2$ can not only reduce the viscosity of glass at high temperatures, but also has a certain fluxing effect. However, too many $Ti^{4+}$ ions can easily cause ion displacement polarization in a local internal electric field, which leads to the increase of dielectric constant of the glass. In the electronic-grade glass fiber composition according to the present disclosure, the content range of $TiO_2$ can be 0.05-0.8%. Preferably, the content range of $TiO_2$ can be 0.05-0.6%, and more preferably can be 0.05-0.45%. Further, the content range of $Na_2O$+$TiO_2$ can be less than 1.1%, preferably less than 0.8%.

$Fe_2O_3$ facilitates the melting of glass and can also improve the crystallization performance of glass. In the electronic-grade glass fiber composition according to the present disclosure, the content range of $Fe_2O_3$ can be 0.05-0.7%, preferably 0.05-0.6%. $Fe_2O_3$ contains both $Fe^{2+}$ and $Fe^{3+}$ ions, and both of them have certain coloring effect. As $Fe^{3+}$ ions absorb the light in the ultraviolet region and $Fe^{2+}$ ions absorb the light in the infrared region, maintaining an appropriate proportion of ferrous ions in the glass will be good both for heat absorption of the glass liquid when it is heated up and for heat dissipation of the glass liquid when cooled down; it can also strengthen the convection of the glass liquid, improve the cooling and hardening rates of the glass stream when attenuated, reduce the fiber breakage and increase the strength of glass fiber.

Moreover, the tendency of ion displacement polarization of $Fe^{2+}$ is weaker than that of $Fe^{3+}$ ions. Further, the weight percentage ratio of FeO/$Fe_2O_3$ in the present disclosure can be greater than or equal to 0.40. Preferably, the weight percentage ratio of FeO/$Fe_2O_3$ can be greater than or equal to 0.50, more preferably can be 0.50-0.85, and even more preferably can be 0.55-0.80.

$F_2$ is conducive to glass melting and refining and, in combination with iron ions, it can also produce volatile $FeF_3$ or colorless $Na_3FeF_6$, which would reduce the colorability of glass. A proper amount of fluorine being introduced helps to improve dielectric constant of glass. However, fluorine is volatile and has to be removed from the exhaust gas. In the electronic-grade glass fiber composition according to the present disclosure, the weight percentage range of $F_2$ can be 0.01-1.2%, preferably can be 0.05-1.2%, and more preferably can be 0.1-1%. In another embodiment of this disclosure, the weight percentage range of $F_2$ can be 0.4-1%.

Meanwhile, according to this disclosure, the combined weight percentage of $SiO_2$, $Al_2O_3$, $B_2O_3$, CaO, MgO, $Na_2O$, $K_2O$, $Li_2O$, $TiO_2$, $Fe_2O_3$ and $F_2$ can be greater than or equal to 98.5%. Preferably, the combined weight percentage of $SiO_2$, $Al_2O_3$, $B_2O_3$, CaO, MgO, $Na_2O$, $K_2O$, $Li_2O$, $TiO_2$, $Fe_2O_3$ and $F_2$ can be greater than or equal to 99%, more preferably can be greater than or equal to 99.5%, and even more preferably can be greater than or equal to 99.8%. In addition to the above-mentioned main components, the composition according to the present disclosure can also contain a small amount of other components.

Further, the composition according to the present disclosure contains one or more components selected from the group consisting of $SO_3$, SrO, $CeO_2$, $La_2O_3$, $Y_2O_3$, $ZrO_2$ and ZnO, and the total amount of $SO_3$, SrO, $CeO_2$, $La_2O_3$, $Y_2O_3$, $ZrO_2$ and ZnO is less than 1.5% by weight percentage. Further, the total amount of $SO_3$, SrO, $CeO_2$, $La_2O_3$, $Y_2O_3$, $ZrO_2$ and ZnO is less than 1% by weight percentage. Further, the total amount of $SO_3$, SrO, $CeO_2$, $La_2O_3$, $Y_2O_3$, $ZrO_2$ and ZnO is less than 0.5% by weight percentage. Further, the composition contains less than 0.5% in percentage amount by weight of $SO_3$. In addition, in another embodiment of this disclosure, the composition is substantially free of $P_2O_5$ in order to control production cost and improve environmental protection. In still another embodiment of this disclosure, the composition is substantially free of SrO so as to control production cost and glass density.

In addition, the expression "substantially free of" concerning a certain component in the description of this disclosure means the component is present in the composition only in trace amount, for example in the form of trace impurities unintentionally introduced with a glass raw material. The weight percentage of this component in the composition is 0-0.03%, and in most cases 0-0.01%.

Furthermore, a dielectric constant of the electronic-grade glass fiber according to the present disclosure is 6.0-7.0 at 1 MHz and room temperature. Preferably, the dielectric constant is 6.0-6.85, and more preferably, the dielectric constant is 6.35-6.80.

Furthermore, according to another aspect of this disclosure, a use condition is provided for the electronic-grade glass fiber composition of this disclosure, wherein a tank furnace production method is adopted using at least one roof-firing burner.

In the electronic-grade glass fiber composition according to the present disclosure, the beneficial effects produced by the aforementioned selected ranges of the components will be explained by way of examples through the specific experimental data.

The following are examples of preferred content ranges of the components contained in the electronic-grade glass fiber composition according to the present disclosure.

Preferred Example 1

The electronic-grade glass fiber composition according to the present disclosure comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O$=$Na_2O$ + $K_2O$ + $Li_2O$ | <1% |
| RO + $R_2O$ | ≤25.2% |
| $TiO_2$ | 0.05-0.8% |
| $Fe_2O_3$ | 0.05-0.7% |
| $F_2$ | 0.01-1.2% | wherein, the weight percentage ratio C1=$SiO_2$/(RO+$R_2O$) is greater than or equal to 2.20, the weight percentage ratio C2=($SiO_2$+$Al_2O_3$−$B_2O_3$)/(RO+$R_2O$) is greater than or equal to 2.73, and the total weight percentage of the above components is greater than or equal to 98.5%.

Preferred Example 2

The electronic-grade glass fiber composition according to the present disclosure comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O$=$Na_2O$ + $K_2O$ + $Li_2O$ | ≤0.8% |
| $TiO_2$ | 0.05-0.8% |
| $Fe_2O_3$ | 0.05-0.7% |
| $F_2$ | 0.01-1.2% | wherein, the weight percentage ratio C1=$SiO_2$/(RO+$R_2O$) is greater than or equal to 2.20, the weight percentage ratio C2=($SiO_2$+$Al_2O_3$−$B_2O_3$)/(RO+$R_2O$) is greater than or equal to 2.73, the weight percentage ratio C3=($SiO_2$+$Al_2O_3$)/(RO+$R_2O$+$B_2O_3$) is greater than or equal to 2.50, and the total weight percentage of the above components is greater than or equal to 98.5%.

Preferred Example 3

The electronic-grade glass fiber composition according to the present disclosure comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.3% |
| MgO | 1-5.5% |
| RO=CaO + MgO | ≤24.4% |
| $R_2O$=$Na_2O$ + $K_2O$ + $Li_2O$ | <1% |
| RO + $R_2O$ | ≤25.2% |
| $TiO_2$ | 0.05-0.8% |
| $Fe_2O_3$ | 0.05-0.7% |
| $F_2$ | 0.01-1.2% | wherein, the weight percentage ratio C1=$SiO_2$/(RO+$R_2O$) is greater than or equal to 2.20, the weight percentage ratio C2=($SiO_2$+$Al_2O_3$−$B_2O_3$)/(RO+$R_2O$) is greater than or equal to 2.73, and the total weight percentage of the above components is greater than or equal to 98.5%.

Preferred Example 4

The electronic-grade glass fiber composition according to the present disclosure comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.3% |
| MgO | 1-5.5% |
| RO=CaO + MgO | ≤24.4% |
| $R_2O$=$Na_2O$ + $K_2O$ + $Li_2O$ | <1% |
| RO + $R_2O$ | 20.5-25% |
| $TiO_2$ | 0.05-0.8% |
| $Fe_2O_3$ | 0.05-0.7% |
| $F_2$ | 0.05-1.2% | wherein, the weight percentage ratio C1=$SiO_2$/(RO+$R_2O$) is greater than or equal to 2.20, the weight percentage ratio C2=($SiO_2$+$Al_2O_3$−$B_2O_3$)/(RO+$R_2O$) is greater than or equal to 2.73, the weight percentage ratio C3=($SiO_2$+$Al_2O_3$)/(RO+$R_2O$+$B_2O_3$) is greater than or equal to 2.50, and the total weight percentage of the above components is greater than or equal to 98.5%.

Preferred Example 5

The electronic-grade glass fiber composition according to the present disclosure comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O$=$Na_2O$ + $K_2O$ + $Li_2O$ | <1% |
| $TiO_2$ | 0.05-0.8% |
| $Fe_2O_3$ | 0.05-0.7% |
| $F_2$ | 0.01-1.2% | wherein, the weight percentage ratio C1=$SiO_2$/(RO+$R_2O$) is 2.24-2.75, the weight percentage ratio C2=($SiO_2$+$Al_2O_3$−$B_2O_3$)/(RO+$R_2O$) is greater than or equal to 2.73, and the total weight percentage of the above components is greater than or equal to 98.5%.

Preferred Example 6

The electronic-grade glass fiber composition according to the present disclosure comprises the following components expressed as percentage amounts by weight:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | ≤24.8% |
| $R_2O$=$Na_2O$ + $K_2O$ + $Li_2O$ | <1% |
| $TiO_2$ | 0.05-0.8% |
| $Fe_2O_3$ | 0.05-0.7% |
| $F_2$ | 0.01-1.2% | wherein, the weight percentage ratio C1=$SiO_2$/(RO+$R_2O$) is 2.24-2.75, the weight percentage ratio C2=($SiO_2$+$Al_2O_3$−$B_2O_3$)/(RO+$R_2O$) is 2.75-3.35, and the total weight percentage of the above components is greater than or equal to 98.5%.

Preferred Example 7

The electronic-grade glass fiber composition according to the present disclosure comprises the following components expressed as percentage amounts by weight:

| | |
|---|---|
| $SiO_2$ | 55-59.5% |
| $Al_2O_3$ | 11.5-16.5% |
| $B_2O_3$ | 0.7-4.5% |
| CaO | 18-23.3% |
| MgO | 1-4.5% |
| RO=CaO + MgO | ≤24.4% |
| $R_2O=Na_2O + K_2O + Li_2O$ | <1% |
| RO + $R_2O$ | 20.5-25% |
| $TiO_2$ | 0.05-0.8% |
| $Fe_2O_3$ | 0.05-0.7% |
| $F_2$ | 0.01-1.2% | wherein, the weight percentage ratio $C1=SiO_2/(RO+R_2O)$ is greater than or equal to 2.20, the weight percentage ratio $C2=(SiO_2+Al_2O_3-B_2O_3)/(RO+R_2O)$ is 2.75-3.35, and the total weight percentage of the above components is greater than or equal to 98.5%.

Preferred Example 8

The electronic-grade glass fiber composition according to the present disclosure comprises the following components expressed as percentage amounts by weight:

| | |
|---|---|
| $SiO_2$ | 55-59.5% |
| $Al_2O_3$ | 11.5-16.5% |
| $B_2O_3$ | 0.7-4% |
| CaO | 18-23.3% |
| MgO | 1-4.5% |
| RO=CaO + MgO | ≤24.4% |
| $R_2O=Na_2O + K_2O + Li_2O$ | ≤0.8% |
| $TiO_2$ | 0.05-0.8% |
| $Fe_2O_3$ | 0.05-0.7% |
| $F_2$ | 0.05-1.2% | wherein, the weight percentage ratio $C1=SiO_2/(RO+R_2O)$ is 2.24-2.75, the weight percentage ratio $C2=(SiO_2+Al_2O_3-B_2O_3)/(RO+R_2O)$ is greater than or equal to 2.73, and the total weight percentage of the above components is greater than or equal to 98.5%.

Preferred Example 9

The electronic-grade glass fiber composition according to the present disclosure comprises the following components expressed as percentage amounts by weight:

| | |
|---|---|
| $SiO_2$ | 55-59.5% |
| $Al_2O_3$ | 12-15.9% |
| $B_2O_3$ | 1-3.5% |
| CaO | 18-22.8% |
| MgO | 1-4.5% |
| RO=CaO + MgO | 20-24.4% |
| $R_2O=Na_2O + K_2O + Li_2O$ | ≤0.8% |
| RO + $R_2O$ | 20.5-25% |
| $TiO_2$ | 0.05-0.8% |
| $Fe_2O_3$ | 0.05-0.7% |
| $F_2$ | 0.05-1.2% | wherein, the weight percentage ratio $C1=SiO_2/(RO+R_2O)$ is 2.24-2.75, the weight percentage ratio $C2=(SiO_2+Al_2O_3-B_2O_3)/(RO+R_2O)$ is 2.75-3.35, the weight percentage ratio $C3=(SiO_2+Al_2O_3)/(RO+R_2O+B_2O_3)$ is greater than or equal to 2.50, and the total weight percentage of the above components is greater than or equal to 98.5%.

DETAILED DESCRIPTION OF THE EMBODIMENTS

In order to better clarify the purposes, technical solutions and advantages of the examples of the present disclosure, the technical solutions in the examples of the present disclosure are clearly and completely described below. Obviously, the examples described herein are just part of the examples of the present disclosure and are not all the examples. All other exemplary embodiments obtained by one skilled in the art on the basis of the examples in the present disclosure without performing creative work shall all fall into the scope of the present disclosure. What needs to be made clear is that, as long as there is no conflict, the examples and the features of examples in the present application can be arbitrarily combined with each other.

In the present disclosure, the components of the electronic-grade glass fiber composition expressed as percentage amounts by weight are: 54.2-60% $SiO_2$, 11-17.5% $Al_2O_3$, 0.7-4.5% $B_2O_3$, 18-23.8% CaO, 1-5.5% MgO, ≤24.8% RO=CaO+MgO, <1% $R_2O=Na_2O+K_2O+Li_2O$, 0.05-0.8% $TiO_2$, 0.05-0.7% $Fe_2O_3$ and 0.01-1.2% $F_2$; wherein the weight percentage ratio $C1=SiO_2/(RO+R_2O)$ is greater than or equal to 2.20, and the total weight percentage of the above components is greater than or equal to 98.5%. The composition has the advantage of low costs and high corrosion resistance. It can improve the electrical properties, especially dielectric properties, of the glass, and increase the mechanical properties, water resistance and acid resistance of the glass; it can also significantly reduce the cost of raw materials, significantly decrease the volatilization of raw materials, and minimize the corrosion of refractories. Thus, the composition is suitable for large-scale tank furnace production.

The specific content values of $SiO_2$, $Al_2O_3$, $B_2O_3$, CaO, MgO, $Na_2O$, $K_2O$, $Li_2O$, $TiO_2$, $Fe_2O_3$ and $F_2$ in the electronic-grade glass fiber composition according to the present disclosure are selected to be used in the examples, which are compared with the properties of five comparative examples (numbered B1-B5) in terms of the following nine property parameters, with B1 being a conventional E-glass fiber composition for electronic applications, B2 being a conventional D-glass fiber composition and B3-B5 being general-purpose E-glass fiber compositions for reinforcement.

(1) Forming temperature, the temperature at which the glass melt has a viscosity of $10^3$ poise.

(2) Liquidus temperature, the temperature at which the crystal nucleuses begin to form when the glass melt cools off—i.e., the upper limit temperature for glass crystallization.

(3) ΔT value, which is the difference between the forming temperature and the liquidus temperature and indicates the temperature range at which fiber drawing can be performed.

(4) Tensile strength, the maximum tensile stress that the glass fiber can withstand, which can be measured on impregnated glass roving according to ASTM D2343.

(5) Dielectric constant, to be determined in a procedure as follows: Mix the glass-making raw materials uniformly and then add them to a platinum crucible; hold the crucible in a high-temperature electric furnace at 1550±30° C. for 6 hours to obtain a well refined and homogenized glass liquid; pour the glass liquid into a preheated stainless steel mold to make glass blocks, hold these glass blocks in a muffle furnace for annealing, and then cut, sand and polish the annealed glass blocks to make rectangular glass pieces with a thickness of about 1.5 mm and a length and width both of about 30 mm; coat the glass pieces with silver to form electrodes and then test these pieces to obtain dielectric constant values. A smaller dielectric constant means a weaker polarization of the glass medium and a better insulation of the glass, and vice versa.

(6) Amount of bubbles, to be determined in a procedure as follows: Use special molds to compress the glass batch materials in each example into samples of same dimension, which will then be placed on the sample platform of a high temperature microscope. Heat the samples according to standard procedures up to the pre-set spatial temperature 1500° C., and then the glass samples is directly cooled off with the cooling hearth to the ambient temperature without heat preservation. Finally, each of the glass samples is examined under a polarizing microscope to determine the amount of bubbles in the samples. Wherein, the amount of bubbles is identified according to a specific amplification of the microscope.

(7) Water resistance, to be characterized in terms of weight loss rate. The test procedure is as follows: Put the glass powder with a particle size of 40-80 mesh into water at 95° C. for 24 hours, stir the mixture at regular intervals, and measure and determine the weight loss rate of the glass powder. A smaller weight loss rate means a better water resistance of the glass, and vice versa.

(8) Acid resistance, to be characterized in terms of weight loss rate. The test procedure is as follows: Put the glass powder with a particle size of 40-80 mesh into 10% HCL solution at 23° C. for 48 hours, stir the mixture at regular intervals, and measure and determine the weight loss rate of the glass powder. A smaller weight loss rate means a better acid resistance of the glass, and vice versa.

(9) Raw material cost coefficient. Set the cost of the conventional E-glass fiber composition B1 as the benchmark, its cost coefficient being 1.0. The costs of other compositions are calculated in comparison with the benchmark. A smaller cost coefficient of raw materials means a lower cost of the composition, and vice versa.

The aforementioned nine parameters and the methods of measuring them are well-known to one skilled in the art. Therefore, these aforementioned parameters can be effectively used to explain the technical features and advantages of the electronic-grade glass fiber composition according to the present disclosure.

The specific procedures for the experiments are as follows: Each component can be acquired from the appropriate raw materials. Mix the raw materials in the appropriate proportions so that each component reaches the final expected weight percentage. The mixed batch is melted and refined. Then the molten glass is drawn out through the tips of the bushings, thereby forming the glass fiber. The glass fiber is attenuated onto the rotary collet of a winder to form cakes or packages. Of course, conventional methods can be used to further process these glass fibers to meet the expected requirement.

Comparisons of the property parameters of the examples of the electronic-grade glass fiber composition according to the present disclosure with those of the comparative examples are further made below by way of tables, wherein the component contents of the compositions for producing glass fiber are expressed as weight percentage. What needs to be made clear is that the total amount of the components in an example is slightly less than 100%, and it should be understood that the remaining amount is trace impurities or a small amount of components which cannot be analyzed.

TABLE 1A

|  |  | A1 | A2 | A3 | A4 | A5 |
|---|---|---|---|---|---|---|
| Component | $SiO_2$ | 58.10 | 58.10 | 58.10 | 58.10 | 58.10 |
|  | $Al_2O_3$ | 14.80 | 14.50 | 14.20 | 15.20 | 13.90 |
|  | CaO | 21.10 | 21.10 | 21.10 | 21.10 | 21.10 |
|  | MgO | 1.90 | 1.90 | 1.90 | 1.50 | 1.90 |
|  | $B_2O_3$ | 2.60 | 2.60 | 2.60 | 2.60 | 3.50 |
|  | $TiO_2$ | 0.30 | 0.30 | 0.30 | 0.30 | 0.30 |
|  | $Fe_2O_3$ | 0.30 | 0.30 | 0.30 | 0.30 | 0.30 |
|  | $K_2O$ | 0.25 | 0.35 | 0.50 | 0.25 | 0.25 |
|  | $Na_2O$ | 0.10 | 0.30 | 0.45 | 0.10 | 0.10 |
|  | $F_2$ | 0.45 | 0.45 | 0.45 | 0.45 | 0.45 |
| Ratio | C1 | 2.49 | 2.46 | 2.43 | 2.53 | 2.49 |
|  | C2 | 3.01 | 2.96 | 2.91 | 3.08 | 2.93 |
|  | C3 | 2.81 | 2.77 | 2.72 | 2.87 | 2.68 |
|  | C4 | 7.43 | 4.00 | 2.74 | 7.43 | 10.00 |
| Parameter | Forming temperature/° C. | 1242 | 1237 | 1230 | 1245 | 1236 |
|  | Liquidus temperature/° C. | 1137 | 1133 | 1127 | 1137 | 1130 |
|  | ΔT/° C. | 105 | 104 | 103 | 108 | 106 |
|  | Tensile strength/MPa | 2250 | 2230 | 2180 | 2270 | 2220 |
|  | Dielectric constant | 6.55 | 6.65 | 6.80 | 6.45 | 6.35 |
|  | Amount of bubbles/pcs | 8 | 7 | 6 | 9 | 7 |
|  | Water resistance, in weight loss rate/% | 0.35 | 0.45 | 0.55 | 0.30 | 0.40 |
|  | Acid resistance, in weight loss rate/% | 0.45 | 0.50 | 0.50 | 0.45 | 0.55 |
|  | Raw material cost coefficient | 0.65 | 0.66 | 0.67 | 0.65 | 0.71 |

TABLE 1B

|  |  | A6 | A7 | A8 | A9 | A10 |
|---|---|---|---|---|---|---|
| Component | $SiO_2$ | 60.00 | 60.00 | 58.00 | 56.60 | 56.60 |
|  | $Al_2O_3$ | 12.00 | 13.10 | 14.50 | 15.90 | 15.00 |
|  | CaO | 20.50 | 21.90 | 21.90 | 21.90 | 21.90 |
|  | MgO | 1.00 | 1.80 | 1.80 | 1.80 | 1.80 |
|  | $B_2O_3$ | 4.50 | 1.00 | 1.90 | 1.90 | 3.25 |
|  | $TiO_2$ | 0.05 | 0.30 | 0.30 | 0.30 | 0.60 |
|  | $Fe_2O_3$ | 0.60 | 0.20 | 0.40 | 0.40 | 0.10 |
|  | $K_2O$ | 0.30 | 0.35 | 0.35 | 0.35 | 0.35 |
|  | $Na_2O$ | 0.20 | 0.25 | 0.25 | 0.25 | 0.25 |
|  | $F_2$ | 0.75 | 1.00 | 0.50 | 0.50 | 0.05 |
| Ratio | C1 | 2.73 | 2.47 | 2.39 | 2.33 | 2.33 |
|  | C2 | 3.07 | 2.97 | 2.91 | 2.91 | 2.81 |
|  | C3 | 2.72 | 2.89 | 2.77 | 2.77 | 2.60 |
|  | C4 | 9.00 | 1.67 | 3.17 | 3.17 | 5.42 |
| Parameter | Forming temperature/° C. | 1244 | 1248 | 1236 | 1232 | 1240 |
|  | Liquidus temperature/° C. | 1134 | 1144 | 1134 | 1129 | 1134 |
|  | ΔT/° C. | 110 | 104 | 102 | 103 | 106 |
|  | Tensile strength/MPa | 2150 | 2270 | 2260 | 2230 | 2180 |
|  | Dielectric constant | 6.50 | 6.85 | 6.70 | 6.75 | 6.65 |
|  | Amount of bubbles/pcs | 8 | 10 | 7 | 6 | 7 |
|  | Water resistance, in weight loss rate/% | 0.45 | 0.40 | 0.40 | 0.35 | 0.35 |

TABLE 1B-continued

|  | A6 | A7 | A8 | A9 | A10 |
|---|---|---|---|---|---|
| Acid resistance, in weight loss rate/% | 0.60 | 0.35 | 0.40 | 0.40 | 0.45 |
| Raw material cost coefficient | 0.80 | 0.58 | 0.63 | 0.62 | 0.70 |

TABLE 1C

|  |  | A11 | A12 | A13 | A14 | A15 |
|---|---|---|---|---|---|---|
| Component | $SiO_2$ | 54.20 | 55.00 | 56.50 | 56.50 | 59.50 |
|  | $Al_2O_3$ | 17.50 | 16.50 | 15.10 | 15.10 | 13.00 |
|  | CaO | 21.00 | 22.80 | 22.40 | 23.30 | 19.00 |
|  | MgO | 2.00 | 1.70 | 1.10 | 1.00 | 4.00 |
|  | $B_2O_3$ | 4.00 | 2.70 | 3.50 | 2.50 | 2.50 |
|  | $TiO_2$ | 0.45 | 0.30 | 0.25 | 0.30 | 0.25 |
|  | $Fe_2O_3$ | 0.05 | 0.30 | 0.35 | 0.30 | 0.35 |
|  | $K_2O$ | 0.30 | 0.30 | 0.25 | 0.30 | 0.30 |
|  | $Na_2O$ | 0.20 | 0.20 | 0.10 | 0.20 | 0.35 |
|  | $F_2$ | 0.20 | 0.10 | 0.35 | 0.40 | 0.65 |
| Ratio | C1 | 2.31 | 2.20 | 2.37 | 2.28 | 2.52 |
|  | C2 | 2.88 | 2.75 | 2.86 | 2.79 | 2.96 |
|  | C3 | 2.61 | 2.58 | 2.62 | 2.62 | 2.77 |
|  | C4 | 8.00 | 5.40 | 10.00 | 5.00 | 3.85 |
| Parameter | Forming temperature/° C. | 1227 | 1232 | 1222 | 1230 | 1236 |
|  | Liquidus temperature/° C. | 1124 | 1129 | 1116 | 1125 | 1130 |
|  | ΔT/° C. | 103 | 103 | 106 | 105 | 106 |
|  | Tensile strength/MPa | 2210 | 2160 | 2180 | 2230 | 2260 |
|  | Dielectric constant | 6.55 | 6.75 | 6.50 | 6.70 | 6.65 |
|  | Amount of bubbles/pcs | 7 | 6 | 6 | 7 | 8 |
|  | Water resistance, in weight loss rate/% | 0.35 | 0.35 | 0.45 | 0.40 | 0.45 |
|  | Acid resistance, in weight loss rate/% | 0.45 | 0.45 | 0.50 | 0.45 | 0.45 |
|  | Raw material cost coefficient | 0.74 | 0.65 | 0.70 | 0.65 | 0.66 |

TABLE 1D

|  |  | A16 | A17 | A18 | A19 | A20 |
|---|---|---|---|---|---|---|
| Component | $SiO_2$ | 57.60 | 57.60 | 56.50 | 57.60 | 58.10 |
|  | $Al_2O_3$ | 14.70 | 14.70 | 14.70 | 14.70 | 14.70 |
|  | CaO | 22.15 | 21.65 | 21.65 | 20.55 | 20.55 |
|  | MgO | 2.15 | 2.15 | 2.15 | 2.15 | 1.65 |
|  | $B_2O_3$ | 1.50 | 2.00 | 3.10 | 3.10 | 3.10 |
|  | $TiO_2$ | 0.35 | 0.35 | 0.35 | 0.35 | 0.35 |
|  | $Fe_2O_3$ | 0.35 | 0.35 | 0.35 | 0.35 | 0.35 |
|  | $K_2O$ | 0.35 | 0.35 | 0.35 | 0.35 | 0.35 |
|  | $Na_2O$ | 0.30 | 0.30 | 0.30 | 0.30 | 0.30 |
|  | $F_2$ | 0.45 | 0.45 | 0.45 | 0.45 | 0.45 |
| Ratio | C1 | 2.31 | 2.36 | 2.31 | 2.47 | 2.54 |
|  | C2 | 2.84 | 2.88 | 2.79 | 2.96 | 3.05 |
|  | C3 | 2.73 | 2.73 | 2.58 | 2.73 | 2.81 |
|  | C4 | 2.31 | 3.08 | 4.77 | 4.77 | 4.77 |
| Parameter | Forming temperature/° C. | 1230 | 1231 | 1224 | 1233 | 1239 |
|  | Liquidus temperature/° C. | 1129 | 1126 | 1119 | 1124 | 1133 |
|  | ΔT/° C. | 101 | 105 | 105 | 109 | 106 |
|  | Tensile strength/MPa | 2270 | 2240 | 2140 | 2170 | 2230 |
|  | Dielectric constant | 6.80 | 6.75 | 6.70 | 6.60 | 6.55 |
|  | Amount of bubbles/pcs | 6 | 7 | 5 | 7 | 8 |
|  | Water resistance, in weight loss rate/% | 0.40 | 0.45 | 0.50 | 0.45 | 0.40 |
|  | Acid resistance, in weight loss rate/% | 0.40 | 0.45 | 0.55 | 0.50 | 0.50 |
|  | Raw material cost coefficient | 0.61 | 0.63 | 0.69 | 0.70 | 0.70 |

TABLE 1E

|  |  | A21 | A22 | A23 | A23 | A25 |
|---|---|---|---|---|---|---|
| Component | $SiO_2$ | 57.50 | 57.50 | 58.10 | 58.10 | 58.10 |
|  | $Al_2O_3$ | 15.00 | 15.00 | 14.70 | 14.70 | 14.70 |
|  | CaO | 20.80 | 20.80 | 20.05 | 20.05 | 20.05 |
|  | MgO | 3.00 | 3.00 | 1.65 | 1.65 | 1.65 |
|  | $B_2O_3$ | 1.95 | 1.95 | 3.10 | 3.10 | 3.10 |
|  | $TiO_2$ | 0.35 | 0.35 | 0.35 | 0.35 | 0.35 |
|  | $Fe_2O_3$ | 0.35 | 0.35 | 0.35 | 0.35 | 0.35 |
|  | $Li_2O$ | — | 0.20 | — | — | — |
|  | SrO | — | — | 0.50 | — | — |
|  | $ZrO_2$ | — | — | — | 0.50 | — |
|  | $La_2O_3$ | — | — | — | — | 0.50 |
|  | $K_2O$ | 0.25 | 0.25 | 0.35 | 0.35 | 0.35 |
|  | $Na_2O$ | 0.25 | 0.05 | 0.30 | 0.30 | 0.30 |
|  | $F_2$ | 0.45 | 0.45 | 0.45 | 0.45 | 0.45 |
| Ratio | C1 | 2.37 | 2.37 | 2.60 | 2.60 | 2.60 |
|  | C2 | 2.90 | 2.90 | 3.12 | 3.12 | 3.12 |
|  | C3 | 2.76 | 2.76 | 2.86 | 2.86 | 2.86 |
|  | C4 | 3.90 | 3.90 | 4.77 | 4.77 | 4.77 |
| Parameter | Forming temperature/° C. | 1233 | 1227 | 1237 | 1245 | 1235 |
|  | Liquidus temperature/° C. | 1131 | 1126 | 1129 | 1131 | 1124 |
|  | ΔT/° C. | 102 | 101 | 108 | 114 | 111 |
|  | Tensile strength/MPa | 2240 | 2300 | 2250 | 2270 | 2270 |
|  | Dielectric constant | 6.70 | 6.65 | 6.50 | 6.40 | 6.35 |
|  | Amount of bubbles/pcs | 7 | 5 | 8 | 10 | 7 |
|  | Water resistance, in weight loss rate/% | 0.35 | 0.30 | 0.40 | 0.35 | 0.40 |
|  | Acid resistance, in weight loss rate/% | 0.45 | 0.40 | 0.45 | 0.45 | 0.45 |
|  | Raw material cost coefficient | 0.62 | 0.76 | 0.71 | 0.73 | 0.73 |

TABLE 1F

|  | B1 | B2 | B3 | B4 | B5 |
|---|---|---|---|---|---|
| Component $SiO_2$ | 54.16 | 73.00 | 59.05 | 56.50 | 54.00 |
| $Al_2O_3$ | 14.32 | 1.00 | 13.08 | 14.70 | 15.20 |
| CaO | 22.12 | 0.60 | 24.29 | 22.50 | 24.00 |
| MgO | 0.41 | 0.50 | 2.83 | 4.00 | 2.10 |
| $B_2O_3$ | 7.26 | 22.00 | 0 | 0.50 | 2.50 |
| $TiO_2$ | 0.34 | 0 | 0.04 | 0.25 | 0.25 |
| $Fe_2O_3$ | 0.39 | 0 | 0.36 | 0.30 | 0.30 |
| $K_2O$ | 0.25 | 2.90 | 0.23 | 0.35 | 0.40 |
| $Na_2O$ | 0.45 |  | 0.03 | 0.55 | 0.90 |
| $F_2$ | 0.29 | 0 | 0.04 | 0.25 | 0.25 |
| Ratio C1 | 2.33 | 18.25 | 2.16 | 2.06 | 1.97 |
| C2 | 2.64 | 13.00 | 2.63 | 2.58 | 2.43 |
| C3 | 2.25 | 2.85 | 2.63 | 2.55 | 2.31 |
| C4 | 10.37 | 7.59 | 0 | 0.56 | 1.92 |
| Parameter Forming temperature/°C. | 1175 | 1410 | 1248 | 1240 | 1215 |
| Liquidus temperature/°C. | 1075 | 1250 | 1169 | 1190 | 1185 |
| ΔT/°C. | 100 | 160 | 79 | 50 | 30 |
| Tensile strength/MPa | 1982 | 1870 | 2290 | 2180 | 2050 |
| Dielectric constant | 6.80 | 4.20 | 7.25 | 7.30 | 7.40 |
| Amount of bubbles/pcs | 10 | 20 | 18 | 10 | 7 |
| Water resistance, in weight loss rate/% | 0.80 | 1.80 | 0.35 | 0.55 | 0.80 |
| Acid resistance, in weight loss rate/% | 4.05 | 9.30 | 0.30 | 0.50 | 0.95 |
| Raw material cost coefficient | 1.00 | 2.00 | 0.51 | 0.56 | 0.70 |

It can be seen from the values in the above tables that, compared with the compositions of general-purpose E-glass fiber for reinforcement, the electronic-grade glass fiber composition according to the present disclosure have the following advantages: (1) lower dielectric constant; (2) lower liquidus temperature; and (3) wider temperature range for fiber formation.

Compared with the composition of the conventional E-glass fiber, the electronic-grade glass fiber composition according to the present disclosure has the following advantages: (1) lower raw material cost; (2) higher tensile strength; (3) better water and acid resistance; and (4) improved dielectric constant levels.

Compared with the composition of the conventional D-glass fiber, the electronic-grade glass fiber composition according to the present disclosure have the following advantages: (1) much lower raw material cost; (2) much higher tensile strength; (3) much better water and acid resistance; and (4) smaller amount of bubbles.

Therefore, it can be seen from the above that, compared with the compositions of general-purpose E-glass fiber for reinforcement, conventional E-glass fiber and conventional D-glass fiber, the electronic-grade glass fiber composition according to the present disclosure has made a breakthrough in terms of cost performance of products, raw material cost, dielectric constant, tensile strength, liquidus temperature, temperature range for fiber formation, water resistance and acid resistance. With unexpected technical effects, the composition enables an easy achievement of large-scale tank furnace production.

The electronic-grade glass fiber composition according to the present disclosure can be used for making glass fibers for electronic applications having the aforementioned properties. The glass fibers can then be used for making electronic fabrics.

The electronic-grade glass fiber composition according to the present disclosure in combination with one or more organic and/or inorganic materials can be used for preparing composite materials having excellent performance, such as glass fiber reinforced base materials.

It is to be noted that, in this text, the terms "comprise/comprising", "contain/containing" and any other variants thereof are non-exclusive, so that any process, method, object or device containing a series of elements contains not only such factors, but also other factors not listed clearly, or further contains inherent factors of the process, method, object or device. Without further restrictions, a factor defined by the statement "comprises/comprising an/a . . . ", "contain/containing an/a . . . " or any other variants thereof does not exclude other identical factors in the process, method, object or device including said factors.

The foregoing embodiments are provided only for describing instead of limiting the technical solutions of the present disclosure. While particular embodiments of the disclosure have been shown and described, it will be obvious to one skilled in the art that modifications can be made to the technical solutions embodied by all the aforementioned embodiments, or that equivalent replacements can be made to some of the technical features embodied by all the aforementioned embodiments, without departing from the spirit and scope of the technical solutions of the present disclosure.

INDUSTRIAL APPLICABILITY

The electronic-grade glass fiber composition according to the present disclosure can improve the dielectric properties of glass, and increase the mechanical properties, water resistance and acid resistance of glass fiber; it can also significantly reduce the cost of raw materials, significantly decrease the volatilization of raw materials, and minimize the corrosion of refractories. Thus, the composition is suitable for large-scale tank furnace production.

Compared with conventional glass fiber compositions, the electronic-grade glass fiber composition according to the present disclosure has made a breakthrough in terms of cost performance of products, raw material cost, dielectric constant, tensile strength, liquidus temperature, temperature range for fiber formation, and water and acid resistance.

Therefore, the present disclosure has good industrial applicability.

What is claimed is:
1. An electronic-grade glass fiber composition, comprising the following components with corresponding amounts by weight percentages:

| | |
|---|---|
| $SiO_2$ | 54.2-60% |
| $Al_2O_3$ | 11-17.5% |
| $B_2O_3$ | 0.7-4.5% |
| CaO | 18-23.8% |
| MgO | 1-5.5% |
| RO=CaO + MgO | less than or equal to 24.8% |
| $R_2O=Na_2O + K_2O + Li_2O$ | less than 1% |
| $TiO_2$ | 0.05-0.8% |
| $Fe_2O_3$ | 0.05-0.7% |
| $F_2$ | 0.01-1.2% |
| $P_2O_5$ | 0-0.03% | wherein a weight percentage ratio C1=SiO$_2$/(RO+R$_2$O) is greater than or equal to 2.31, and a total weight percentage of the SiO$_2$, Al$_2$O$_3$, B$_2$O$_3$, CaO, MgO, Na$_2$O, K$_2$O, Li$_2$O, TiO$_2$, Fe$_2$O$_3$ and F$_2$ is greater than or equal to 99.5%;

wherein the electronic-grade glass fiber composition further comprises one or more components selected from the group consisting of SO$_3$, SrO, CeO$_2$, La$_2$O$_3$, Y$_2$O$_3$, and ZrO$_2$, with a combined weight percentage of the one or more components being less than 0.5%; and wherein the electronic-grade glass composition does not comprise ZnO.

2. The electronic-grade glass fiber composition of claim 1, wherein the weight percentage of F$_2$ is 0.05-1.2%.

3. The electronic-grade glass fiber composition of claim 1, wherein the weight percentage of R$_2$O is less than or equal to 0.8%.

4. The electronic-grade glass fiber composition of claim 1, wherein the weight percentage of RO is 20-24.4%.

5. The electronic-grade glass fiber composition of claim 1, wherein the combined weight percentage of RO+R$_2$O is 20.5-25%.

6. The electronic-grade glass fiber composition of claim 1, wherein a combined weight percentage of Al$_2$O$_3$+MgO is 13-19.1%.

7. The electronic-grade glass fiber composition of claim 1, wherein a weight percentage ratio of K$_2$O/Na$_2$O is greater than 0.5.

8. The electronic-grade glass fiber composition of claim 1, wherein a weight percentage ratio C2=(SiO$_2$+Al$_2$O$_3$—B$_2$O$_3$)/(RO+R$_2$O) is greater than or equal to 2.73.

9. The electronic-grade glass fiber composition of claim 1, wherein a weight percentage ratio C3=(SiO$_2$+Al$_2$O$_3$)/(RO+R$_2$O+B$_2$O$_3$) is greater than or equal to 2.50.

10. The electronic-grade glass fiber composition of claim 1, wherein a weight percentage ratio C4=B$_2$O$_3$/R$_2$O is greater than or equal to 1.

11. The electronic-grade glass fiber composition of claim 1, comprising the following components with corresponding amounts by weight percentages:

| | |
|---|---|
| SiO$_2$ | 54.2-60% |
| Al$_2$O$_3$ | 11-17.5% |
| B$_2$O$_3$ | 0.7-4.5% |
| CaO | 18-23.8% |
| MgO | 1-5.5% |
| RO=CaO + MgO | less than or equal to 24.8% |
| R$_2$O=Na$_2$O + K$_2$O + Li$_2$O | less than 1% |
| RO + R$_2$O | less than or equal to 25.2% |
| TiO$_2$ | 0.05-0.8% |
| Fe$_2$O$_3$ | 0.05-0.7% |
| F$_2$ | 0.01-1.2% | wherein the weight percentage ratio C1=SiO$_2$/(RO+R$_2$O) is greater than or equal to 2.31, and a total weight percentage of the above components is greater than or equal to 99.5%.

12. The electronic-grade glass fiber composition of claim 1, comprising the following components with corresponding amounts by weight percentages:

| | |
|---|---|
| SiO$_2$ | 54.2-60% |
| Al$_2$O$_3$ | 11-17.5% |
| B$_2$O$_3$ | 0.7-4.5% |
| CaO | 18-23.8% |
| MgO | 1-5.5% |
| RO=CaO + MgO | less than or equal to 24.8% |
| R$_2$O=Na$_2$O + K$_2$O + Li$_2$O | less than 1% |
| TiO$_2$ | 0.05-0.8% |
| Fe$_2$O$_3$ | 0.05-0.7% |
| F$_2$ | 0.01-1.2% | wherein the weight percentage ratio C1=SiO$_2$/(RO+R$_2$O) is greater than or equal to 2.31, a weight percentage ratio C2=(SiO$_2$+Al$_2$O$_3$—B$_2$O$_3$)/(RO+R$_2$O) is greater than or equal to 2.73, a weight percentage ratio C3=(SiO$_2$+Al$_2$O$_3$)/(RO+R$_2$O+B$_2$O$_3$) is greater than or equal to 2.50, and a total weight percentage of the above components is greater than or equal to 99.5%.

13. The electronic-grade glass fiber composition of claim 1, comprising the following components with corresponding amounts by weight percentages:

| | |
|---|---|
| SiO$_2$ | 55-59.5% |
| Al$_2$O$_3$ | 11.5-16.5% |
| B$_2$O$_3$ | 0.7-4.5% |
| CaO | 18-23.3% |
| MgO | 1-4.5% |
| RO=CaO + MgO | less than or equal to 24.4% |
| R$_2$O=Na$_2$O + K$_2$O + Li$_2$O | less than 1% |
| RO + R$_2$O | 20.5-25% |
| TiO$_2$ | 0.05-0.8% |
| Fe$_2$O$_3$ | 0.05-0.7% |
| F$_2$ | 0.05-1.2% | wherein the weight percentage ratio C1=SiO$_2$/(RO+R$_2$O) is greater than or equal to 2.31, a weight percentage ratio C2=(SiO$_2$+Al$_2$O$_3$—B$_2$O$_3$)/(RO+R$_2$O) is greater than or equal to 2.73, and a total weight percentage of the above components is greater than or equal to 99.5%.

14. The electronic-grade glass fiber composition of claim 1, comprising the following components with corresponding amounts by weight percentages:

| | |
|---|---|
| SiO$_2$ | 55-59.5% |
| Al$_2$O$_3$ | 12-15.9% |
| B$_2$O$_3$ | 1-3.5% |
| CaO | 18-23.3% |
| MgO | 1.1-4% |
| RO=CaO + MgO | less than or equal to 24.4% |
| R$_2$O=Na$_2$O + K$_2$O + Li$_2$O | less than or equal to 0.8% |
| RO + R$_2$O | 20.5-25% |
| TiO$_2$ | 0.05-0.8% |
| Fe$_2$O$_3$ | 0.05-0.7% |
| F$_2$ | 0.05-1.2% | wherein the weight percentage ratio C1=SiO$_2$/(RO+R$_2$O) is 2.31-2.75, a weight percentage ratio C2=(SiO$_2$+Al$_2$O$_3$—B$_2$O$_3$)/(RO+R$_2$O) is 2.75-3.35, a weight percentage ratio C3=(SiO$_2$+Al$_2$O$_3$)/(RO+R$_2$O+B$_2$O$_3$) is greater than or equal to 2.50, and a total weight percentage of the above components is greater than or equal to 99.5%.

15. An electronic-grade glass fiber comprising the composition of claim 1.

16. The electronic-grade glass fiber of claim 15, having a dielectric constant of 6.0-7.0 at 1 MHz at room temperature.

17. An electronic fabric, comprising the glass fiber of claim 15.

18. A printed circuit board, comprising a base material comprising the electronic fabric of claim 17.

* * * * *